United States Patent [19]

Djennas et al.

[11] Patent Number: 4,883,774

[45] Date of Patent: Nov. 28, 1989

[54] SILVER FLASHING PROCESS ON SEMICONDUCTOR LEADFRAMES

[75] Inventors: Frank Djennas, Mesa; Curtis W. Mitchell, Scottsdale, both of Ariz.

[73] Assignee: Motorola, Inc., Schaumburg, Ill.

[21] Appl. No.: 171,097

[22] Filed: Mar. 21, 1988

[51] Int. Cl.$^4$ .............................................. H01L 21/44
[52] U.S. Cl. ...................................... 437/211; 437/210; 437/245; 428/647; 428/936; 427/098
[58] Field of Search ................ 228/208, 193; 428/647, 428/929, 673, 671; 427/118, 98, 120; 437/211

[56] References Cited

U.S. PATENT DOCUMENTS

| | | | |
|---|---|---|---|
| 3,893,949 | 7/1975 | Sakai et al. | 502/241 |
| 4,214,364 | 7/1980 | St. Louis et al. | 29/827 |
| 4,716,081 | 12/1987 | Ehrreich | 428/403 |
| 4,756,467 | 7/1988 | Schatzberg | 228/208 |
| 4,765,833 | 8/1988 | Narumiya et al. | 75/68 R |

Primary Examiner—Brian E. Hearn
Assistant Examiner—Beverly A. Pawlikowski
Attorney, Agent, or Firm—Harry A. Wolin

[57] ABSTRACT

A process for flashing a thin layer of silver on metal leadframes using no mask steps and a minimal amount of silver. An unmasked metal leadframe is placed into a cleaning bath that includes silver in solution and has no outside electrical driving force to assist plating. The leadframe is removed from the cleaning bath once a uniform silver layer having a thickness of 100 to 1000 angstroms is plated thereon. The silver layer need not be exact and, therefore, it is not critical that the period of time the leadframe remains in the cleaning bath be exact.

12 Claims, 1 Drawing Sheet

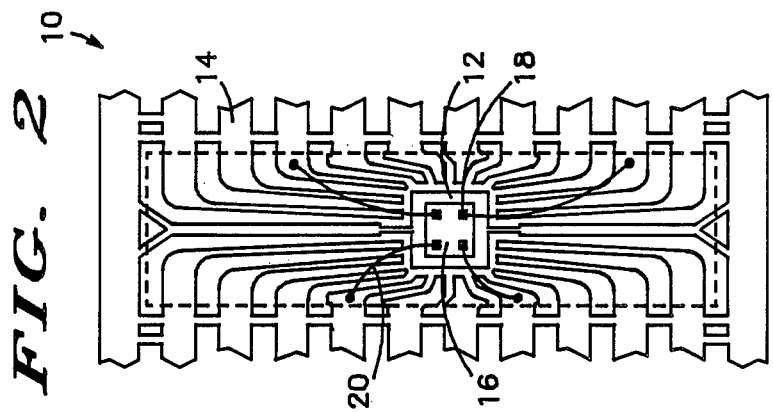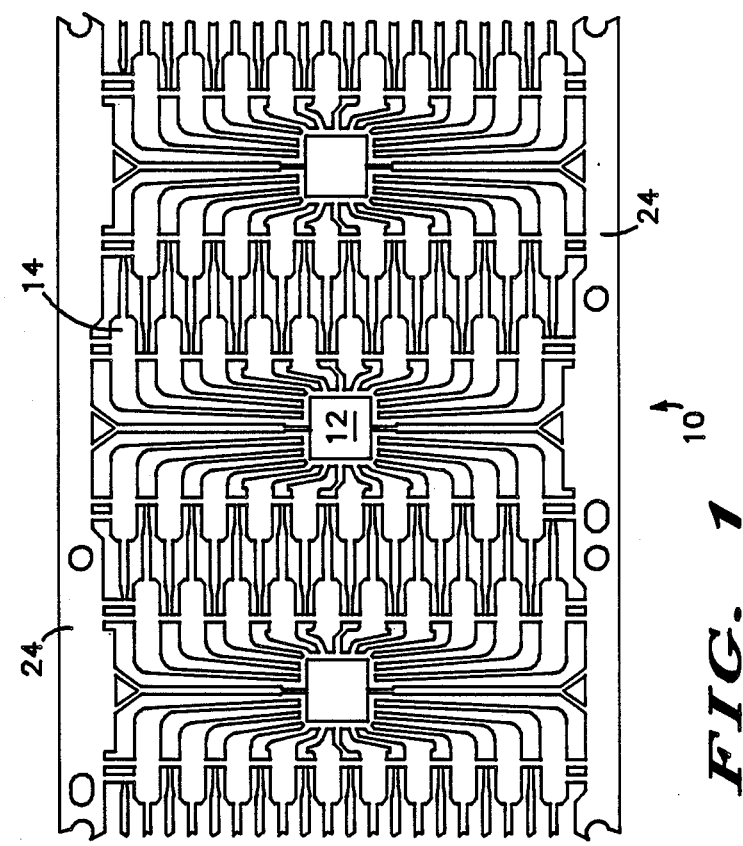

SILVER FLASHING PROCESS ON SEMICONDUCTOR LEADFRAMES

BACKGROUND OF THE INVENTION

This invention relates, in general, to a process for forming a thin silver layer on metal leadframes used in manufacturing semiconductor products, and more particularly to a method for flashing silver on copper leadframes using no masks on the leadframes or outside electrical driving forces in the cleaning bath.

Electroplating metal leadframes with various other metals to obtain desired characteristics and properties is well known in the art. Copper leadframes are commonly electroplated with silver and/or tin to improve oxidation resistance and enhance thermal and electrical conductivities. However, current processes for electroplating metal leadframes are expensive and time consuming.

For example, semiconductor integrated circuit dual in-line packages (DIPs) and the like that employ a copper leadframe commonly have a thick layer of silver electroplated only on the flag. The thickness of this layer ranges between 75,000 and 90,000 angstroms and must be exact. In order for this to be accomplished, a mask or series of masks must be employed on a leadframe. The masked leadframe is then placed into an electrolytic bath containing silver in solution. The bath includes an anode and a cathode between which an electrical current flows. This serves as an outside electrical driving force to enhance electroplating speed. Following assembly of the semiconductor device on the leadframe and the plastic encapsulation of the device, the leads are then plated with tin to prevent oxidation and allow for improved thermal and electrical conductivities in the leads.

Arranging a mask or series of masks on a leadframe is an extremely time consuming and, therefore, expensive process. Masks must be exactly fitted and if they are not, silver whiskers result. The whiskers diffuse because of the material gradients and cause a non-homogenous surface on the leadframe which increases the difficulty in future processing steps as well as causing poor adhesion between the plastic encapsulation and the leadframe. The poor adhesion allows moisture to penetrate the semiconductor device.

The thick layer of silver which is utilized on the leadframe is extremely expensive. To obtain this thick layer, the leadframe must remain in the cleaning bath for a substantial period of time. In view of the above, a silver flashing process for metal leadframes which is inexpensive, has a short bath time and does not use excessive amounts of material will be extremely valuable.

SUMMARY OF THE INVENTION

Accordingly, it is an object of the present invention to provide a process for plating metal leadframes which uses no masks.

Another object of the present invention is to provide a process for plating metal leadframes employing n anode or cathode in the cleaning bath.

It is an additional object of the present invention to provide a process for plating metal leadframes that requires a short period of time.

Yet a further object of the present invention is to provide a process for plating metal leadframes which uses a relatively small amount of plating metal.

An even further object of the present invention is to provide a process for plating metal leadframes in which the entire leadframe is plated thereby eliminating diffusion related defects.

Another object of the present invention is to provide a process for plating metal leadframes wherein the layer of plating metal need not be of an exact thickness.

The foregoing and other objects and advantages are achieved in the present invention by one embodiment in which, as a part thereof, includes placing a copper leadframe into a cleaning bath which includes silver in solution. The cleaning bath contains no outside electrical driving force. The present invention makes use of no masks and allows the entire copper leadframe to be plated with a very thin layer of plating metal such as silver.

A more complete understanding of the present invention can be attained by considering the following detailed description in conjunction with the accompanying drawings.

BRIEF DESCRIPTION OF THE DRAWINGS

FIG. 1 illustrates a top view of three connected sixteen lead DIP leadframes; and FIG. 2 illustrates a highly enlarged top view of a sixteen lead DIP leadframe including a semiconductor die and wire bonds.

DETAILED DESCRIPTION OF THE DRAWINGS

FIG. 1 illustrates a top view of three connected sixteen lead dual in-line package (DIP) leadframes 10. Each leadframe 10 includes a flag 12 and a plurality of leads 14. Rails 24 are disposed of at the top and bottom of leadframe 10. Rails 24 connect many leadframes together and are employed for leadframe manufacturing as well as IC processing. It should be understood that rails 24 are removed and are not included in the final semiconductor package. In this embodiment, leadframe 10 is comprised of copper although other metals well known in the art may also be employed.

FIG. 2 illustrates a highly enlarged top view of leadframe 10 further including a semiconductor die 16 which has been bonded to flag 12 of leadframe 10 by methods well known in the art. Semiconductor die 16 includes a plurality of bond pads 18. Wire bonds 20 extend from bond pads 18 of semiconductor die 16 to leads 14 of leadframe 10. Wire bonds 20 electrically connect semiconductor die 16 to leads 14 of leadframe 10. A dotted line 22 represents the outer perimeter of a plastic encapsulation. Portions of leads 14 extend beyond dotted line 22 and enable the semiconductor device to become physically and electrically connected in various systems.

Prior to bonding semiconductor die 16 to leadframe 10, leadframe 10 is placed into a cleaning bath. The cleaning bath includes silver in solution which will chemically plate on copper leadframe 10. Because no masks are applied to leadframe 10 prior to its being placed in the cleaning bath, silver will plate uniformly on the entirety of leadframe 10. Leadframe 10 is removed from the cleaning bath once a thin, uniform layer of silver has been plated thereon. This silver layer has a thickness in the range of 100 to 1000 angstroms and a preferred thickness is approximately 500 angstroms. It should be understood that the thickness of the silver layer need not be exact in this application. Because the desired silver layer is so thin, no outside electrical driving force need be applied in the cleaning bath. It should be understood that the silver layer chemically deposits on copper leadframe 10.

Since the silver layer has a maximum thickness of 1000 angstroms, leadframe 10 need only be placed in the cleaning bath for a short length of time. Additionally, since the thickness of the silver layer does not need to be exact, the time it remains in the cleaning bath does not need to be exact either. A substantial time savings is gained because a mask is not applied to leadframe 10. By employing no masks in this process, no silver diffusion problems occur along material gradients and the surface of leadframe 10 remains homogenous. Further, the uniform silver layer enhances adhesion between leadframe 10 and the plastic encapsulation represented by dotted line 22 of FIG. 2.

Following the encapsulation of leadframe 10, leads 14 are plated with tin. The tin plating allows for improved oxidation resistance as well as improved thermal and electrical conductivities. It should be understood, however, that tin plating of leads 14 is not essential because leads 14 have previously been electroplated with silver. The tin plating of leads 14 is merely an optional step.

It was previously believed that a thick silver layer was needed on the flag of copper leadframes in applications of this type. This was so that the copper would not migrate to the top surface of the silver layer and oxidize, thereby causing bonding difficulties. This thick silver layer was formed only on the flag so that it did not migrate and cause shorting throughout the package and especially on the leads. The thin silver layer of the present invention eliminates silver migration problems and sufficiently keeps the copper of the leadframe from reaching the top of the silver surface.

Thus it is apparent that there has been provided, in accordance with the invention, a new and improved process for electroplating silver on metal leadframes. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A process for flashing a thin layer of silver on metal semiconductor leadframes comprising the steps of:
   providing a metal leadframe;
   placing said metal leadframe, unmasked, into a cleaning bath, said cleaning bath including silver in solution and having no outside electrical driving force; and
   removing said metal leadframe from said cleaning bath following plating of a predetermined thin layer of silver on said entire metal leadframe.

2. The process of claim 1 wherein the providing step includes providing a copper leadframe.

3. The process of claim 2 wherein the removing step includes removing the copper leadframe when 100 to 1000 angstroms of silver has been plated thereon.

4. The process of claim 3 wherein the removing step includes removing the copper leadframe when approximately 500 angstroms of silver has been plated thereon.

5. A process for flashing a thin layer of silver on copper semiconductor leadframes comprising the steps of:
   providing a copper leadframe;
   placing said copper leadframe, unmasked, into a cleaning bath, said cleaning bath including silver in solution and having no outside electrical driving force; and
   removing said copper leadframe from said cleaning bath following plating of 100 to 1000 angstroms of silver on said entire copper leadframe.

6. The process of claim 5 wherein the removing step includes removing the copper leadframe when approximately 500 angstroms of silver has been plated thereon.

7. A process for making a semiconductor device comprising the steps of:
   providing a metal leadframe having a plurality of leads;
   placing said metal leadframe, unmasked, into a cleaning bath, said cleaning bath including silver in solution and having no outside electrical driving force;
   removing said metal leadframe from said cleaning bath following plating of a predetermined thin layer of silver on said entire metal leadframe;
   bonding a semiconductor die to said metal leadframe;
   electrically connecting said semiconductor die to said plurality of leads of said metal leadframe; and
   encapsulating said metal leadframe excluding said plurality of leads in plastic.

8. The process of claim 7 wherein the providing step includes providing a copper leadframe.

9. The process of claim 8 wherein the removing step includes removing the copper leadframe when 100 to 1000 angstroms of silver has been plated thereon 10. The process of claim 9 wherein the removing step includes removing the copper leadframe when approximately 500 angstroms of silver has been plated thereon.

11. The process of claim 10 wherein the electrically connecting step includes wirebonding.

12. The process of claim 11 further including the step of plating the plurality of leads of the copper leadframe with tin following the encapsulating step.

* * * * *